(12) United States Patent
Hasegawa (10) Patent No.: US 7,566,934 B2
(45) Date of Patent: Jul. 28, 2009

(54) SEMICONDUCTOR DEVICE TO SUPPRESS LEAK CURRENT AT AN END OF AN ISOLATION FILM

(75) Inventor: Hisashi Hasegawa, Chiba (JP)

(73) Assignee: Seiko Instruments Inc. (JP)

( * ) Notice: Subject to any disclaimer, the term of this patent is extended or adjusted under 35 U.S.C. 154(b) by 14 days.

(21) Appl. No.: 11/707,709

(22) Filed: Feb. 16, 2007

(65) Prior Publication Data

US 2008/0012077 A1   Jan. 17, 2008

(30) Foreign Application Priority Data

Feb. 20, 2006  (JP) .............................. 2006-041908
Feb. 14, 2007  (JP) .............................. 2007-032907

(51) Int. Cl.
*H01L 29/96* (2006.01)

(52) U.S. Cl. .............................. 257/345; 257/E29.268; 438/289; 438/306

(58) Field of Classification Search ................. 257/345, 257/E29.268; 438/289, 306
See application file for complete search history.

(56) References Cited

U.S. PATENT DOCUMENTS

2005/0085045 A1* 4/2005 Okihara ....................... 438/369
2005/0146942 A1* 7/2005 Madurawe ............. 365/189.05

* cited by examiner

*Primary Examiner*—Douglas M Menz
*Assistant Examiner*—Steven J Fulk
(74) *Attorney, Agent, or Firm*—Adams & Wilks (57) ABSTRACT

A semiconductor device is formed on an SOI substrate having a silicon layer formed on an insulating layer. A transistor element is formed in the silicon layer of the SOI substrate. An isolation film for electrically isolating the transistor element is formed in the silicon layer of the SOI substrate by LOCOS so that a parasitic transistor is formed. Impurity diffusion regions are disposed at an end of the isolation film and at a boundary of a source region of the transistor element with a channel forming region. The impurity diffusion regions have a polarity opposite to that of the source region. A current path due to a parasitic channel in the parasitic transistor is suppressed.

16 Claims, 5 Drawing Sheets

Bird's beak

SEMICONDUCTOR DEVICE TO SUPPRESS LEAK CURRENT AT AN END OF AN ISOLATION FILM

BACKGROUND OF THE INVENTION

1. Field of the Invention

The present invention relates to a semiconductor device having a semiconductor element such as a transistor formed thereon.

2. Description of the Related Art

A semiconductor device formed on a silicon-on-insulator (SOI) substrate is provided with an isolation film (a field oxide film) for electrically isolating (insulating) a semiconductor element (transistor element) formed on a silicon layer from others.

Local oxidation of silicon (abbreviated as LOCOS) is a method to form the field oxide film. The LOCOS (or selective oxidation) is a method of forming an oxide film through a thermal oxidation process with respect to a silicon layer with a nitride film as a mask, thereby forming a field oxide film.

Use of an isolation method based on the LOCOS (LOCOS isolation) generates a region, commonly called a bird's beak, where the field oxide film grows thin, at the end of a field oxide film, more specifically, at the boundary with a region where a semiconductor element is formed (an active region).

At the bird's beak, thinning of the active layer in the SOI substrate causes lowering of a threshold voltage in a gate voltage of the transistor element.

Such lowering of the threshold voltage causes the leakage (leak current) at the bird's beak by the operation (turn-on) of the parasitic transistor before the start of the operation of a transistor at a designed value, that is, before sufficient rise in the gate voltage.

A conventional art for suppressing such a leak current at a bird's beak is disclosed in Japanese Patent Application JP 2003-124303A.

The disclosure proposes a technique for suppressing leak current by implanting an impurity between a bird's beak formed at an end of a field oxide film and an insulating layer (BOX oxide film layer) of an SOI substrate, that is, in a region where a channel (path of electrons) is formed at a voltage lower than a predetermined gate voltage.

By the disclosure, a precise condition setting for implanting an impurity (field doping) is required while considering many factors such as a concentration of the impurity to be implanted and a processing temperature for the impurity not to be implanted in a standard channel region. Accordingly, implanting of an impurity for suppressing leak current has been difficult.

SUMMARY OF THE INVENTION

Accordingly, an object of the present invention is to provide a semiconductor device which suppresses generation of leak current at an end of an isolation film by an easier method.

To achieve the above-mentioned object, according to a first aspect of the present invention, there is provided a semiconductor device formed using an SOI substrate having a silicon layer formed on an insulating layer, including: a transistor element formed in the silicon layer in the SOI substrate; an isolation film for electrically isolating the transistor element, the isolation film being formed in the silicon layer of the SOI substrate by LOCOS; and impurity diffusion regions formed at ends of the isolation film at boundaries of impurity diffusion layers of the transistor element with a channel forming region, the impurity diffusion regions having a polarity opposite to that of the impurity diffusion layers.

According to a second aspect of the present invention, in the semiconductor device according to the first aspect of the present invention, the impurity diffusion regions are formed at a boundary of source region of the transistor element with the channel forming region.

According to a third aspect of the present invention, in the semiconductor device according to the first aspect of the present invention, the impurity diffusion regions are formed between the insulating layer of the SOI substrate and bird's beak at the ends of the isolation film.

According to a fourth aspect of the present invention, in the semiconductor device according to first of the present invention, the transistor element is of a fully depleted type.

According to a fifth aspect of the present invention, in the semiconductor device according to the first aspect of the present invention, the polarity of the impurity diffusion layers to be the source region and drain region of the transistor element and a polarity of polycrystalline silicon to be a gate electrode of the transistor element are the same. It is preferable that the gate electrode claimed in the fifth aspect of the present invention is made from, for example, polycrystalline silicon.

According to the present invention, by providing the impurity diffusion regions formed at the ends of the isolation film formed using LOCOS, at the boundary of the impurity diffusion layers of the transistor element with the channel forming region, the impurity diffusion regions having a polarity opposite to that of the impurity diffusion layers, even if a parasitic transistor formed at the end of the isolation film operates, electrons cannot move from the impurity diffusion layer of the transistor element, and thus, leak current can be suppressed.

DETAILED DESCRIPTION OF THE PREFERRED EMBODIMENTS

A preferred embodiment of the present invention is now described in detail with reference to FIGS. 1 to 5.

(1) Overview of Embodiment

A semiconductor device is described in which n-type and p-type fully depleted MOS transistor elements are formed using an SOI substrate having an embedded oxide film layer and a silicon layer (an active layer) formed on the embedded oxide film layer.

In the semiconductor device according to this embodiment, a field oxide film which works as an isolation film for electrically isolating (insulating) an NMOS transistor element and a PMOS transistor element is formed.

The field oxide film is formed by LOCOS (selective oxidation). More specifically, a thermal oxidation process is carried out with a silicon nitride film as a mask, and a silicon oxide film is formed in the active layer (silicon layer) of the SOI substrate, thereby forming the field oxide film.

When the LOCOS isolation method is used to form a field oxide film; at the end of a field oxide film, more specifically, at the boundary with a region where a semiconductor element is formed (an active region), so-called bird's beak where the field oxide film grows thin is generated, thereby forming a parasitic transistor.

The semiconductor device according to this embodiment is provided with channel cut regions for suppressing leak current due to the parasitic transistor.

The channel cut region in the NMOS transistor is formed of P+ diffusion regions (impurity diffusion regions) at an end of the field oxide film (a bird's beak) at two points of a boundary of an N+ diffusion layer (source) with a P well diffusion layer (channel forming region), the P+ diffusion regions having a polarity opposite to that of the N+ diffusion layer (source).

Similarly, the channel cut region in the PMOS transistor is formed of N+ diffusion regions (impurity diffusion regions) at an end of the field oxide film (a bird's beak) at two points of a boundary of a P+ diffusion layer (source) with an N well diffusion layer (channel forming region), the N+ diffusion regions having a polarity opposite to that of the P+ diffusion layer (source).

It is to be noted that the channel cut regions in the respective transistor elements are formed to fill regions between bird's beaks of the field oxide film and an embedded insulating film layer of the SOI substrate, and further, to develop from the bird's beaks of the field oxide film into the N+ diffusion layer (source) of the NMOS transistor and into the P+ diffusion layer (source) of the PMOS transistor, respectively.

According to the embodiment, by providing the channel cut regions, current paths due to parasitic channels in parasitic transistors can be cut off, that is, leak current flowing from drain diffusion layer to source diffusion layer through the parasitic channels can be cut off.

In this way generation of humps in Vg-Id (gate voltage-drain current) characteristics in the NMOS and the PMOS can be suppressed.

(2) Detailed Description of Embodiment

Figure 1A:
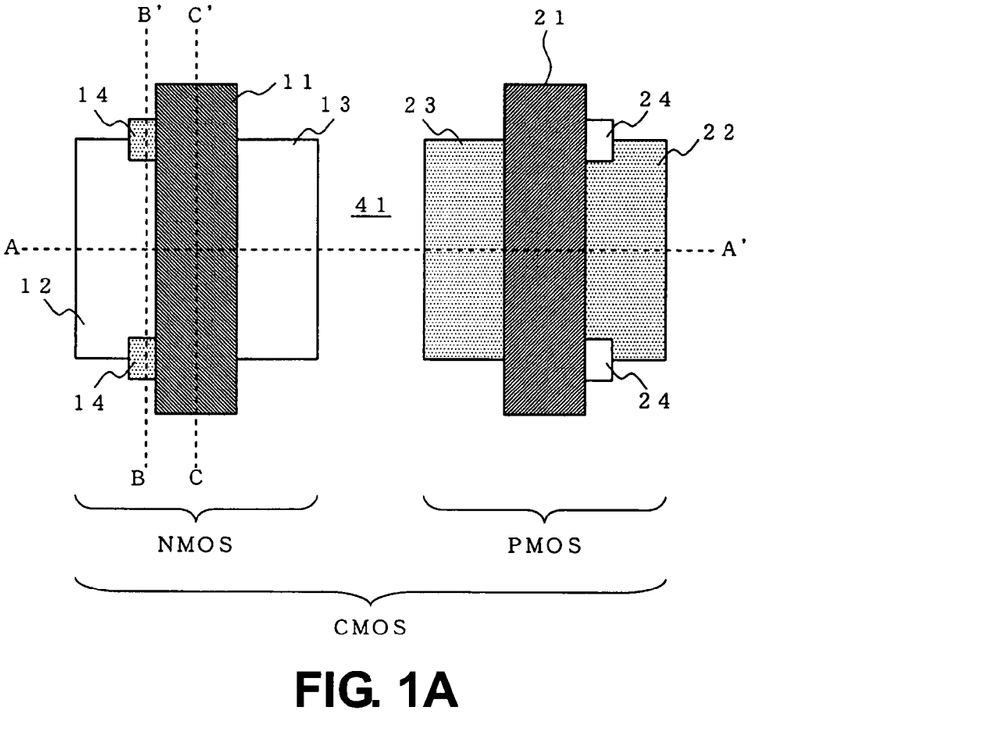
FIG. 1A is a plan view illustrating a schematic structure of a semiconductor device according to an embodiment of the present invention.

FIG. 1A is a plan view illustrating a schematic structure of a semiconductor device according to this embodiment.

Figure 1B:
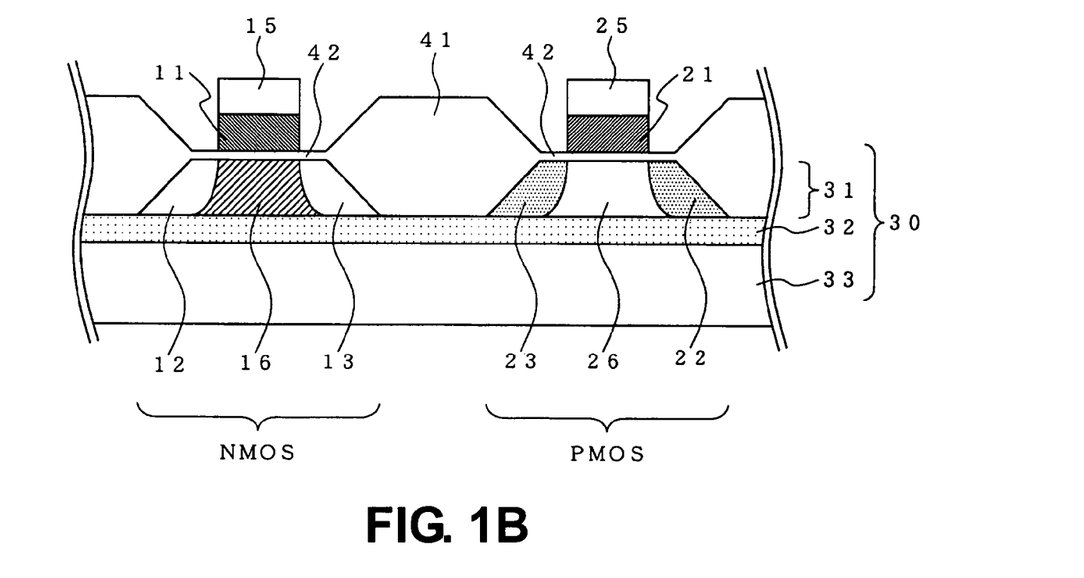
FIG. 1B is a sectional view taken along the line A-A' of FIG. 1A.

FIG. 1B is a sectional view taken along the line A-A' of FIG. 1A.

Figure 2A:
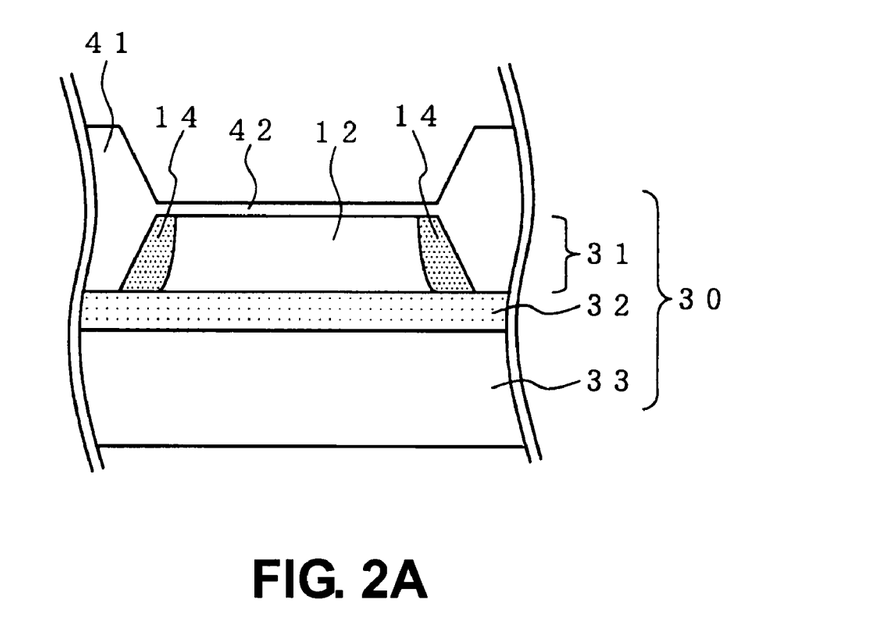
FIG. 2A is a sectional view taken along the line B-B' of FIG. 1A.
Figure 2B:
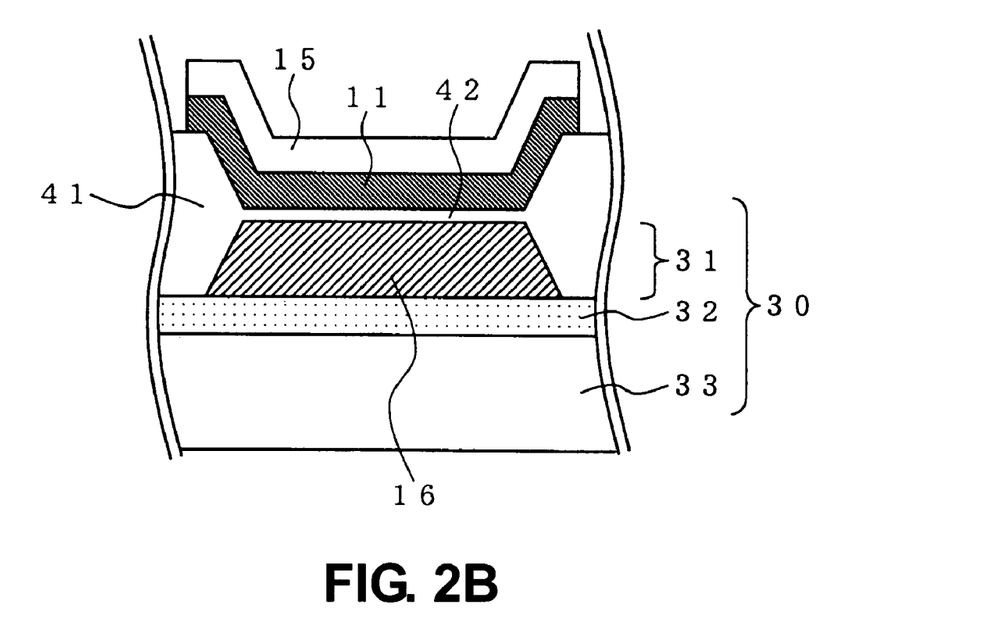
FIG. 2B is a sectional view taken along the line C-C' of FIG. 1A.

FIG. 2A is a sectional view taken along the line B-B' of FIG. 1A and FIG. 2B is a sectional view taken along the line C-C' of FIG. 1A.

In this embodiment, as an exemplary semiconductor device, a CMOS transistor having a combination of an n-type MOS transistor and a p-type MOS transistor formed therein is described.

As illustrated in FIGS. 1A and 1B, the semiconductor device (semiconductor element) according to this embodiment has an N-type MOS transistor (hereinafter referred to as NMOS), a P-type MOS transistor (hereinafter referred to as PMOS), and a field oxide film 41 for electrically isolating (insulating) the NMOS and the PMOS, that is, the transistor elements.

It is to be noted that the field oxide film 41 functions as an isolation film.

Further, the semiconductor device according to this embodiment is formed using an SOI substrate 30 having a three-layer structure of a silicon layer (an active layer) 31, an embedded insulating film layer (an embedded oxide film layer) 32, and a silicon substrate (a supporting layer) 33.

In the SOI substrate 30, the silicon layer 31 and the silicon substrate 33, that is, the active layer and the supporting layer of the SOI substrate 30, are insulated from each other by the embedded insulating film layer 32 in between.

The NMOS, PMOS, and the field oxide film 41 are formed in the silicon layer 31, that is, in the region of the active layer of the SOI substrate 30.

In the semiconductor device according to this embodiment, the NMOS and the PMOS formed using the SOI substrate 30 are of a fully depleted type (hereinafter referred to as FD type).

An FD transistor element has a low junction capacitance around the source/drain which is advantageous for a high speed operation and steep subthreshold characteristics which are advantageous for a low voltage operation.

It is to be noted that, in this embodiment, in order to form the FD transistor elements, the thickness of the active layer (silicon layer 31) in the SOI substrate 30 is, for example, in a range of 30 to 100 nm.

Further, the thickness of the embedded insulating film layer 32 in the SOI substrate 30 is, for example, in a range of 100 to 500 nm.

In the active region of the NMOS, an N+ diffusion layer (source) 12 and an N+ diffusion layer (drain) 13 which are heavily doped impurity diffusion layers are formed to have a single drain structure.

A gate electrode 11 formed of N+ polycrystalline silicon is provided in a region between the N+ diffusion layer (source) 12 and the N+ diffusion layer (drain) 13 on a gate oxide film 42.

A refractory metal silicide 15 is laminated on the gate electrode 11.

In this way, application of a laminated polycide gate structure, in which the refractory metal silicide 15 is deposited on the gate electrode 11 formed of N+ polycrystalline silicon, to the gate electrode of the NMOS enables the lowering of the resistance of the gate electrode.

As the refractory metal silicide 15, tungsten silicide, molybdenum silicide, titanium silicide, platinum silicide, or the like are used.

A P well diffusion layer 16 is formed in the silicon layer 31 (the active layer of the SOI substrate 30) in a region between the gate electrode 11 formed of N+ polycrystalline silicon and the embedded insulating film layer 32, that is, in a body region of the NMOS.

The P well diffusion layer 16 functions as a path for electrons that flow between a source region and a drain region, that is, as a channel forming region where a channel is formed, when a voltage is applied to the gate electrode.

On the other hand, in the active region of the PMOS, a P+ diffusion layer (source) 22 and a P+ diffusion layer (drain) 23 which are heavily doped impurity diffusion layers are formed to have a single drain structure.

A gate electrode 21 formed of P+ polycrystalline silicon is provided in a region between the P+ diffusion layer (source) 22 and the P+ diffusion layer (drain) 23 on a gate oxide film 42.

A refractory metal silicide 25 is laminated on the gate electrode 21.

In this way, application of a laminated polycide gate structure, in which the refractory metal silicide 25 is deposited on the gate electrode 21 formed of P+ polycrystalline silicon, to the gate electrode of the PMOS enables the lowering of the resistance of the gate electrode.

As the refractory metal silicide 25, tungsten silicide, molybdenum silicide, titanium silicide, platinum silicide, or the like are used.

An N well diffusion layer 26 is formed in the silicon layer 31 (the active layer of the SOI substrate 30) in a region between the gate electrode 21 formed of P+ polycrystalline silicon and the embedded insulating film layer 32, that is, in a body region of the PMOS.

The N well diffusion layer 26 works as a path for electrons that flow between a source region and a drain region, that is, as a channel forming region where a channel is formed, when a voltage is applied to the gate electrode.

In an FDSOI device as shown in the embodiment, the body region is required to be depleted even when the gate is off. Accordingly in an NMOS transistor the polarity of the gate electrode is N-type, and in a PMOS transistor the polarity is P-type. More specifically, as mentioned above, the gate electrode for an NMOS transistor is made from N+ type polycrystalline silicon, and for a PMOS transistor from P+ type polycrystalline silicon, that is, in these transistor devices the conductivity polarity for the impurity diffusion layers constructing the source and drain regions and that for the gate electrode are the same, thus adopting a homo-polar (dual gate) structure.

Equalizing the polarity of the diffusion layer forming the source and drain regions, that is, the polarity of the MOS transistor, and that of the gate electrode makes the structure of both the NMOS and PMOS transistor surface channel structure, lowering the gate threshold voltage in both the NMOS and PMOS transistor and suppressing the leak current. Reduction in operating voltage of the transistors can thus be conducted properly.

In addition it is preferable that the impurity concentration of the gate electrode for both the NMOS and PMOS transistor is higher than that of source and drain regions. In an NMOS transistor, for example, the gate electrode is preferably made from high concentration (N++) polycrystalline silicon whose impurity concentration is higher than that of the n+ source diffusion region 12 and the n+ drain diffusion region 13. In a PMOS transistor, the gate electrode is preferably made from high concentration (P++) polycrystalline silicon whose impurity concentration is higher than that of the p+ source diffusion region 22 and the p+ drain diffusion region 23.

Making the impurity concentration in the gate electrode high enables not only suppression of delay in gate electrode, which leads to high speed operation in transistor devices, but also improvement in accuracy of depletion in the body region. Moreover making the impurity concentration in the gate electrode high will show the suppression of the short channel effect, in which degradation in device characteristic (electrical characteristic) is caused by the reduction in distance between the source region and the drain region, that is, reduction in gate length and channel length, and resulting interference between these regions. Specifically lowering in the gate threshold voltage, lowering in the drain current rising, and increase in leak current at stand-by occur.

Introduction of high concentration impurity (ion) to the gate electrode polycrystalline silicon is conducted with a high-current ion implanter having a beam current of 2 to 30 mA.

Further, in the semiconductor device according to the embodiment, the field oxide film 41 for electrically isolating the NMOS and the PMOS is formed by an oxidation process of local oxidation of silicon (LOCOS) with respect to the silicon layer 31 as the active layer of the SOI substrate 30.

Sufficient thickness of the isolation film, that is, the field oxide film 41 is required to surely isolate parasitic MOS transistors formed under the field oxide film 41. Simple increase in the thickness, however, extends a step, leading to easy break in interconnecting lines. LOCOS method gives planarization of the surface and, at the same time, formation of a thick oxide film for isolation (insulation).

Here, a method of forming the field oxide film 41 by LOCOS (selective oxidation) is described.

FIGS. 3A to 3F illustrate process steps of forming the field oxide film 41 by LOCOS in the semiconductor device according to this embodiment.

Figure 3A:
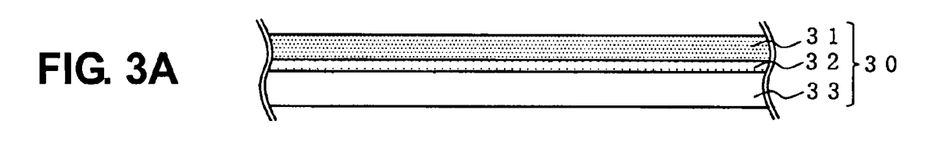
FIGS. 3A to 3F are diagrams illustrating process steps of forming a field oxide film using LOCOS in the semiconductor device according to the embodiment of the present invention.

The semiconductor device according to this embodiment is formed using the SOI substrate 30 having the three-layer structure of the silicon layer (active layer) 31, the embedded insulating film layer 32, and the silicon substrate (supporting layer) 33 illustrated in FIG. 3A.

Figure 3B:
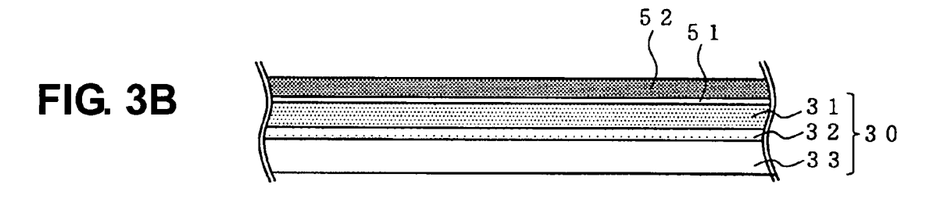

First, as illustrated in FIG. 3B, a pad oxide film 51 for protecting a surface of the silicon layer 31 is formed, and after that, a silicon nitride (SiN) film 52 is deposited by chemical vapor deposition (CVD).

Figure 3C:
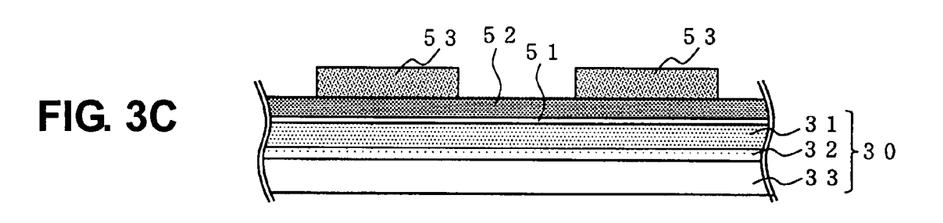

Then, as illustrated in FIG. 3C, a photoresist 53 is formed such that the silicon nitride film 52 is left in element regions, that is, portions of the active region where the NMOS and the PMOS are to be formed. It is to be noted that the photoresist 53 is formed using photolithography.

After that, unnecessary portions of the silicon nitride film 52 which are not masked by the photoresist 53 are removed by dry etching such as reactive ion etching (RIE).

Figure 3D:
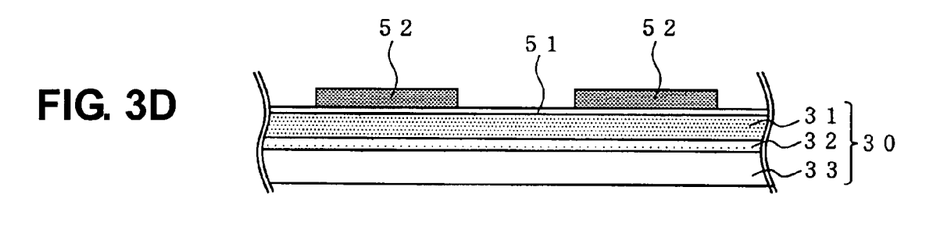

Further, as illustrated in FIG. 3D, the photoresist 53 is removed. The photoresist 53 is removed by, for example, oxidation using oxygen plasma and decomposition to CO.

Figure 3E:
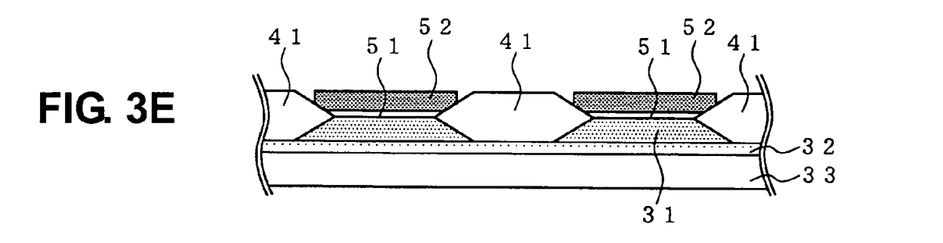

Then, as illustrated in FIG. 3E, the silicon layer 31 is oxidized at a high temperature to develop the thick field oxide film 41.

Regions which are not masked by the silicon nitride film 52 are oxidized. Because the silicon nitride film 52 is highly resistant to oxidation, the active regions where the NMOS and the PMOS are to be formed are scarcely oxidized and only the field regions are oxidized.

Figure 3F:
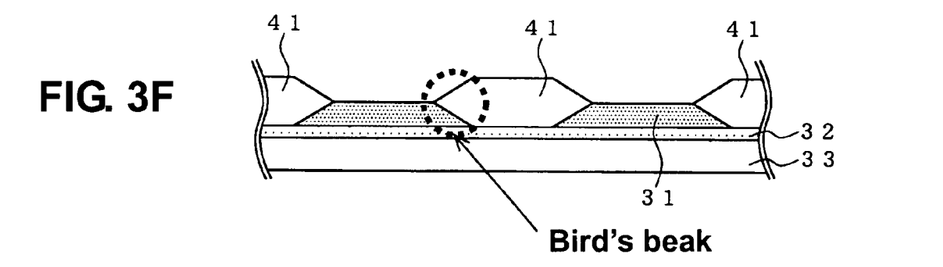

After the oxidation process of the silicon layer 31 is completed, as illustrated in FIG. 3F, the pad oxide film 51 and the silicon nitride film 52 are removed.

When the LOCOS isolation method is used to form a field oxide film 41, sinking (extension) of the field oxide 41 under the nitride film 52 forms so-called bird's beak, where the field oxide film 41 grows like a bird's beak, at the end of a field oxide film 41, more specifically, at the boundary between the active region and the field region.

In such a bird's beak of a region to which a gate electrode extends, lack of the thickness in the formation of the field oxide film 41 leads to formation of a parasitic transistor whose active layer is thin, when a gate electrode is disposed at the bird's beak. Such a parasitic transistor operates at a voltage lower than a desired threshold (designed value) of a gate voltage of the NMOS or the PMOS, forming a parasitic channel.

Then in the semiconductor device according to the embodiment, in order to suppress (decrease) leak current caused by the operation (turn on) of such a parasitic transistor, that is, formation of a parasitic channel, P+ diffusion regions 14 are formed in the NMOS and N+ diffusion regions 24 are formed in the PMOS as channel cut regions, respectively.

Here, the P+ diffusion regions 14 as the channel cut region in the NMOS are described. It is to be noted that, because the N+ diffusion regions 24 as the channel cut region in the PMOS have a structure similar to that of the P+ diffusion regions 14 as the channel cut region in the NMOS, description thereof is omitted.

The P+ diffusion regions 14 as the channel cut region in the NMOS are, as illustrated in FIGS. 1A and 2A, impurity diffusion regions at an end of the field oxide film 41 (a bird's beak) at two points of a boundary of the N+ diffusion layer (source) 12 with the P well diffusion layer 16 (channel forming region). The P+ diffusion regions 14 are of a polarity opposite to that of the N+ diffusion layer (source) 12.

Figure 4:
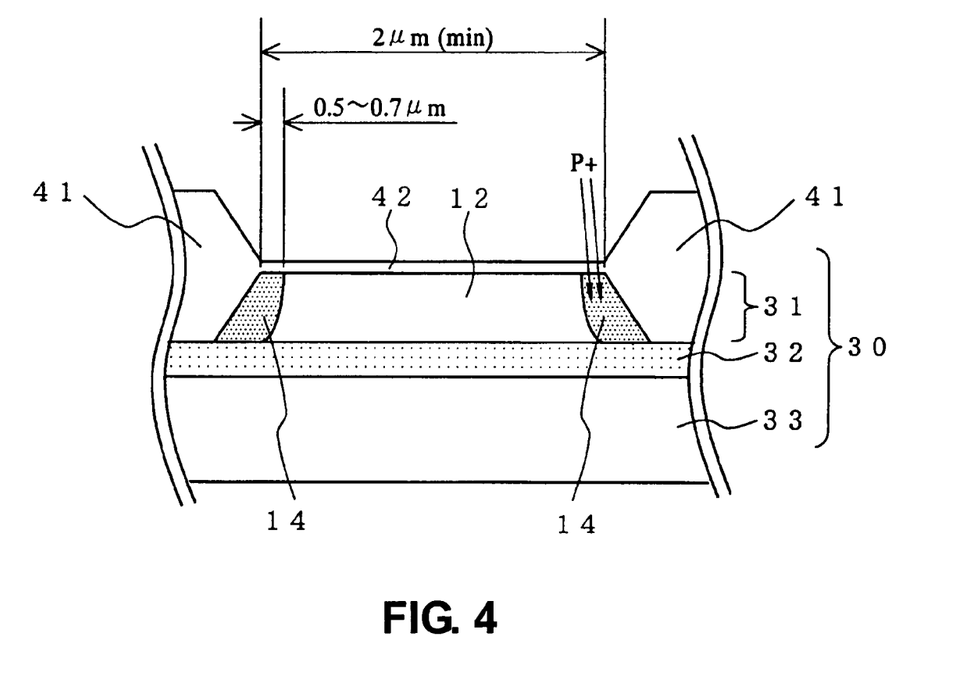
FIG. 4 is a sectional view taken along the line B-B' of FIG. 1A.

As illustrated in FIG. 4, the P+ diffusion regions 14 (channel cut region) are formed so as to fill regions between an end of the field oxide film 41 (bird's beak) and the embedded insulating film layer 32 of the SOI substrate 30, and further, to develop from the end of the field oxide film 41 (bird's beak) in the direction of the N+ diffusion layer (source) 12 of the NMOS.

It is to be noted that, as illustrated in FIG. 4, the P+ diffusion regions 14 are formed such that, in a transistor element in which the length of the active region (N+ diffusion layers 12 and 13) of the NMOS in a gate electrode forming direction is 2 μm (at minimum), for example, the length of the P+ diffusion regions 14 developed in the direction of the N+ diffusion layer (source) 12 of the NMOS is about 0.5 to 0.7 μm.

As described above, it is preferable that the length of the P+ diffusion regions 14 developed toward the N+ diffusion layer (source) 12 of the NMOS be set in a range which does not affect the movement of electrons when the NMOS is normally operated (when the gate is on).

As illustrated in FIG. 4, the P+ diffusion regions 14 as the channel cut region in the NMOS are formed by implanting an impurity (ions) from the surface of the substrate.

In this way, the P+ diffusion regions 14 can be easily formed after the field oxide film 41 (field region) and the transistor element (NMOS) are formed in the SOI substrate 30.

Further, in the semiconductor device according to this embodiment, as illustrated in FIGS. 1B and 2B, the refractory metal silicide 15 is laminated on the gate electrode 11 made from N+ polycrystalline silicon.

Accordingly, if the impurities (ions)) which are implanted to form the P+ diffusion regions 14, are also implanted to the region of the gate electrode, masking the gate electrode with the refractory metal silicide 15 adequately suppresses intrusion of the impurities (ions) into the body region, that is, the P well diffusion layer 16 of the NMOS.

In this way, according to the embodiment, construction of the impurity diffusion regions (P+ diffusion regions 14) having a polarity opposite to that of the N+ diffusion layer (source) 12 at the end of the field oxide film 41 (bird's beak) at the boundary of the N+ diffusion layer (source) 12 with the P well diffusion layer 16 (channel forming region), can cut off or decrease current paths due to the parasitic channel, that is, leak current flowing from the N+ diffusion layer 13 to the N+ diffusion layer 12 through the parasitic channel when the gate of the NMOS is turned off.

In this way generation of humps in Vg-Id (gate voltage-drain current) characteristics in the NMOS can be suppressed.

Similarly, construction of the impurity diffusion regions (N+ diffusion regions 24) having a polarity opposite to that of the P+ diffusion layer (source) 22 at the end of the field oxide film 41 (bird's beak) at the boundary of the P+ diffusion layer (source) 22 with the N well diffusion layer 26 (channel forming region), can cut off or decrease current paths due to the parasitic channel, that is, leak current flowing from the P+ diffusion layer 23 to the P+ diffusion layer 22 in the PMOS.

In this way generation of humps in Vg-Id (gate voltage-drain current) characteristics in the PMOS can be suppressed.

Consequently, leak current flowing through the parasitic channels can be cut off or decreased without raising the threshold (set voltage) of the gate voltage in the NMOS and the PMOS.

Further, according to this embodiment, the P+ diffusion regions 14 and the N+ diffusion regions 24 as the channel cut regions can be easily formed after the field oxide film 41 (field region) and the transistor elements (the NMOS and the PMOS) are formed in the SOI substrate 30 without complicated procedures such as calculating the temperature conditions when field doping is carried out as in the case of the conventional example.

According to this, embodiment, because the structure (layout) of the transistor elements (the NMOS and the PMOS) can be formed similar to a case where a conventional bulk silicon substrate is used, a conventional manufacturing technique can be applied to the semiconductor device formed using the SOI substrate 30.

According to the embodiment, leak current flowing through the parasitic channels can be cut off or decreased without changing the structure (layout) of the transistor elements (the NMOS and the PMOS), that is, without extending the regions where the transistor elements are formed.

Since the NMOS and the PMOS according to this embodiment are FD transistor elements, connection of the body regions (body contacts) are unnecessary. Accordingly, it is not necessary to maintain the P+ diffusion regions 14 in the NMOS at the same potential as that of the N+ diffusion layer (source) 12, and thus, it is not necessary to form a contact portion with the P+ diffusion regions 14.

Similarly, since it is not necessary to maintain the N+ diffusion regions 24 in the PMOS at the same potential as that of the P+ diffusion layer (source) 22, it is not necessary to form a contact portion with the N+ diffusion regions 24.

This eliminates the necessity of a contact region, and thus, leak current flowing through the parasitic channels can be cut off or decreased without making larger the region where the transistor elements are formed.

A contact region may, however, be additionally provided when a source-body tie structure, in which a source and an impurity diffusion layer the polarity of which is opposite to that of the source are electrically connected with each other, is, for example, chosen.

It is to be noted that, although the NMOS and the PMOS transistors according to the embodiment use a simple basic MOS structure, the structure of the transistor elements is not limited thereto.

Figure 5:
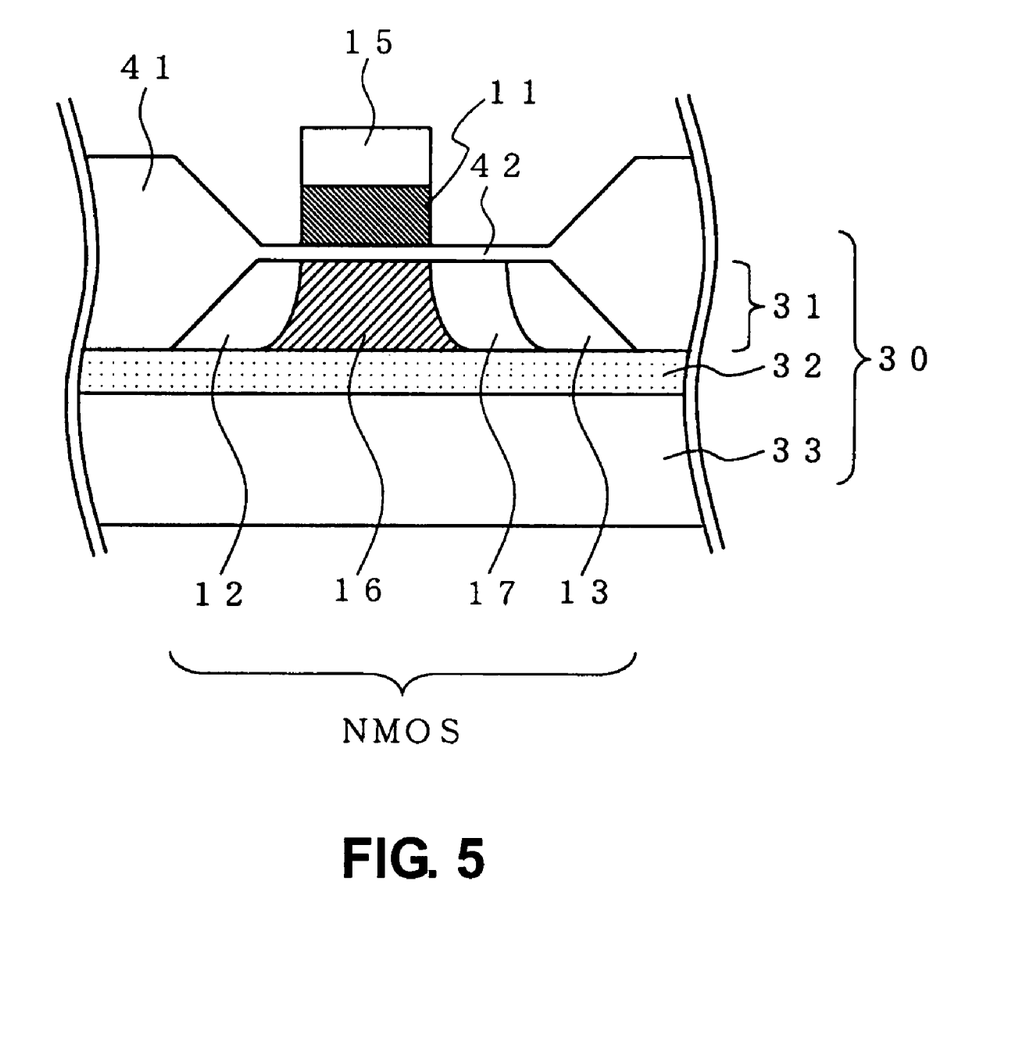
FIG. 5 is a diagram illustrating an exemplary structure having a drain extension.

For example, as illustrated in FIG. 5, a structure in which an N− diffusion layer (a drain extension) 17 is provided (implanted) may be applied.

It is to be noted that the drain extension, that is, the N+ diffusion layer 17 may be formed using a lightly doped drain (LDD) or a mask layout.

What is claimed is:

1. A semiconductor device formed on an SOI substrate having a silicon layer formed on an insulating layer, the semiconductor device comprising:

a transistor element formed in the silicon layer of the SOI substrate;

an isolation film for electrically isolating the transistor element, the isolation film being formed in the silicon layer of the SOI substrate by LOCOS so that a parasitic transistor is formed;

impurity diffusion regions disposed at an end of the isolation film and at a boundary of a source region of the transistor element with a channel forming region, the impurity diffusion regions having a polarity opposite to that of the source region, so that a current path due to a parasitic channel in the parasitic transistor is suppressed; and an active region containing the source region, the channel forming region and a drain region, and a gate electrode disposed over the active region;

wherein a length of the active region in a gate length direction is at least 2 μm and a length of each of the impurity diffusion regions in the direction of the source region is in the range of about 0.5 to 0.7 μm.

2. A semiconductor device according to claim 1; wherein each of the impurity diffusion regions is formed between the insulating layer of the SOI substrate and a bird's beak at the end of the isolation film.

3. A semiconductor device according to claim 1; wherein the transistor element is a full depletion type transistor.

4. A semiconductor device according to claim 3; wherein the polarity of the source region and a polarity of a polycrystalline silicon of a gate electrode of the transistor element are the same.

5. A semiconductor device comprising:
a silicon-on-insulator (SOI) substrate having a silicon layer formed on an insulating layer;
a transistor element formed in the silicon layer of the SOI substrate;
an isolation film for electrically isolating the transistor element, the isolation film being formed in the silicon layer of the SOI substrate by local oxidation of silicon so that a parasitic transistor is formed;
impurity diffusion regions formed at an end of the isolation film at two points each corresponding to a boundary of an impurity diffusion layer of the transistor element with a channel forming region so that a leak current due to a parasitic channel in the parasitic transistor is suppressed; and
an active region containing the impurity diffusion layer and the channel forming region, and a gate electrode disposed over the active region;
wherein a length of the active region in a gate length direction is at least 2 μm and a length of each of the impurity diffusion regions in the direction of the impurity diffusion layer is in the range of about 0.5 to 0.7 μm.

6. A semiconductor device according to claim 5; wherein the impurity diffusion regions have a polarity opposite to that of the impurity diffusion layer.

7. A semiconductor device according to claim 6; wherein the impurity diffusion layer is a source region of the transistor element.

8. A semiconductor device according to claim 5; wherein the impurity diffusion layer is a source region of the transistor element.

9. A semiconductor device according to claim 5; wherein each of the impurity diffusion regions is formed between the insulating layer of the SOI substrate and the end of the isolation film.

10. A semiconductor device according to claim 5; wherein the transistor element is a full depletion type transistor.

11. A semiconductor device according to claim 5; wherein a polarity of the impurity diffusion layer and a polarity of a polycrystalline silicon of a gate electrode of the transistor element are the same.

12. A semiconductor device according to claim 5; wherein the impurity diffusion layer is a source region of the transistor element.

13. A semiconductor device comprising:
a silicon-on-insulator (SOI) substrate having a silicon layer formed on an insulating layer;
a transistor element formed in the silicon layer of the SOI substrate;
an isolation film for electrically isolating the transistor element, the isolation film being formed in the silicon layer of the SOI substrate by local oxidation of silicon so that a parasitic transistor is formed;
impurity diffusion regions formed so as to fill regions between an end of the isolation film and the insulating layer of the sax substrate and extending from the end of the isolation film in the direction of a source region of the transistor element, so that a current path due to a parasitic channel in the parasitic transistor is suppressed; and
an active region containing the source region, the channel forming region and a drain region, and a gate electrode disposed over the active region;
wherein a length of the active region in a gate length direction is at least 2 μm and a length of each of the impurity diffusion regions in the direction of the source region is in the range of about 0.5 to 0.7 μm.

14. A semiconductor device according to claim 13; wherein the impurity diffusion regions have a polarity opposite Lo that of the source region.

15. A semiconductor device according to claim 13; wherein the transistor element is a full depletion type transistor.

16. A semiconductor device according to claim 13; wherein a polarity of the source region and a polarity of a polycrystalline silicon of a gate electrode of the transistor element are the same.

* * * * *